US010916496B2

(12) United States Patent
Kita

(10) Patent No.: US 10,916,496 B2
(45) Date of Patent: Feb. 9, 2021

(54) CIRCUIT MODULE

(71) Applicant: Murata Manufacturing Co., Ltd., Nagaokakyo (JP)

(72) Inventor: Terumichi Kita, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 109 days.

(21) Appl. No.: 16/133,735

(22) Filed: Sep. 18, 2018

(65) Prior Publication Data

US 2019/0035716 A1 Jan. 31, 2019

Related U.S. Application Data

(63) Continuation of application No. PCT/JP2017/012613, filed on Mar. 28, 2017.

(30) Foreign Application Priority Data

Mar. 31, 2016 (JP) ................................. 2016-073311

(51) Int. Cl.
*H01L 23/498* (2006.01)
*H01L 23/28* (2006.01)
(Continued)

(52) U.S. Cl.
CPC ........ *H01L 23/49822* (2013.01); *H01L 23/00* (2013.01); *H01L 23/28* (2013.01);
(Continued)

(58) Field of Classification Search
None
See application file for complete search history.

(56) References Cited

U.S. PATENT DOCUMENTS 4,374,159 A * 2/1983 Pitetti .................... H01L 27/01
216/109
6,217,990 B1 4/2001 Asai et al.
(Continued)

FOREIGN PATENT DOCUMENTS

JP     10-308582 A     11/1998
JP     2001-284783 A     10/2001
(Continued)

OTHER PUBLICATIONS

Official Communication issued in International Patent Application No. PCT/JP2017/012613, dated May 16, 2017.

*Primary Examiner* — Alexander G Ghyka
(74) *Attorney, Agent, or Firm* — Keating & Bennett, LLP

(57) ABSTRACT

A circuit module includes a multilayer board including an inner-layer ground electrode and an extended electrode that extends from the inner-layer ground electrode in an inner layer thereof, a mounting component mounted on the multilayer board, a resin that covers the mounting component, and a shield electrode that covers the resin and at least a portion of a side surface of the multilayer board. The extended electrode is electrically connected to the inner-layer ground electrode in the multilayer board and at least a portion of the extended electrode overlaps the inner-layer ground electrode when viewed in a lamination direction of the multilayer board. An end portion of the extended electrode is exposed at the side surface of the multilayer board and connected to the shield electrode. An end portion of the inner-layer ground electrode is exposed at the side surface of the multilayer board and connected to the shield electrode.

18 Claims, 8 Drawing Sheets

(51) Int. Cl.
    *H01L 23/00*     (2006.01)
    *H01L 23/552*     (2006.01)
    *H01L 23/29*     (2006.01)
    *H01L 23/31*     (2006.01)
    *H05K 9/00*     (2006.01)
    *H05K 1/02*     (2006.01)
    *H05K 3/46*     (2006.01)

(52) U.S. Cl.
    CPC ........ *H01L 23/293* (2013.01); *H01L 23/3121* (2013.01); *H01L 23/49827* (2013.01); *H01L 23/49838* (2013.01); *H01L 23/552* (2013.01); *H01L 24/17* (2013.01); *H05K 1/02* (2013.01); *H05K 3/46* (2013.01); *H05K 9/00* (2013.01); *H05K 9/0024* (2013.01); *H05K 9/0039* (2013.01); *H01L 2224/16225* (2013.01); *H01L 2224/16227* (2013.01); *H01L 2924/15313* (2013.01); *H01L 2924/19041* (2013.01); *H01L 2924/19042* (2013.01); *H01L 2924/19105* (2013.01); *H01L 2924/3025* (2013.01); *H01L 2924/3511* (2013.01)

(56) References Cited

U.S. PATENT DOCUMENTS

| | | |
|---|---|---|
| 2001/0030061 A1 | 10/2001 | Yoneda |
| 2012/0168214 A1 | 7/2012 | Kashiwagi et al. |
| 2013/0020119 A1 | 1/2013 | Yoshida |
| 2017/0098637 A1 | 4/2017 | Hamada |

FOREIGN PATENT DOCUMENTS

| | | |
|---|---|---|
| JP | 2004-172176 A | 6/2004 |
| JP | 2006-185977 A | 7/2006 |
| JP | 2011-077430 A | 4/2011 |
| JP | 2011-159788 A | 8/2011 |
| JP | 2013-026330 A | 2/2013 |
| WO | 2015/194435 A1 | 12/2015 |

\* cited by examiner

CIRCUIT MODULE

CROSS REFERENCE TO RELATED APPLICATIONS

This application claims the benefit of priority to Japanese Patent Application No. 2016-073311 filed on Mar. 31, 2016 and is a Continuation Application of PCT Application No. PCT/JP2017/012613 filed on Mar. 28, 2017. The entire contents of each application are hereby incorporated herein by reference.

BACKGROUND OF THE INVENTION

1. Field of the Invention

The present invention relates to a circuit module.

2. Description of the Related Art

An example of a known circuit module has a structure including a multilayer board, a plurality of components mounted on a surface of the multilayer board, a resin that covers the components, and a shield layer formed on a surface of the resin (see, for example, Japanese Unexamined Patent Application Publication No. 2004-172176). According to this structure, the shield layer is connected to a ground electrode, which is disposed in the multilayer board, on a front surface or a side surface of the multilayer board.

However, the multilayer board is formed by stacking and pressure-bonding a plurality of insulator layers together, and each insulator layer has patterned wires formed thereon. The density of the patterned wires differs between the insulator layers, and the insulator layers and the patterned wires contract in different manners when the board is fired. Therefore, warping or distortion of the multilayer board may occur.

When the multilayer board has an inner-layer ground electrode connected to a shield electrode at a side surface of the multilayer board, the above-described warping or distortion leads to a reduction in contact area between the inner-layer ground electrode and the shield electrode, and may cause a reduction in the connection reliability between the shield electrode and the inner-layer ground electrode. In such a case, the shielding function of the shield electrode is reduced and the desired module characteristics cannot be obtained.

The term "connection reliability" means the reliability of mechanical and electrical connection between, for example, any two electrodes. In the following description, in particular, it is assumed that the connection reliability is the reliability of electrical connection. Accordingly, to increase the connection reliability between the shield electrode and the inner-layer ground electrode means to reduce the resistance between the shield electrode and the inner-layer ground electrode.

SUMMARY OF THE INVENTION

Preferred embodiments of the present invention provide circuit modules each including a shield electrode and an inner-layer ground electrode that are connected with increased connection reliability.

A circuit module according to a preferred embodiment of the present invention includes a multilayer board including an inner-layer ground electrode and an extended electrode that extends from the inner-layer ground electrode; a mounting component mounted on the multilayer board; a resin that covers the mounting component; and a shield electrode that covers the resin and at least a portion of a side surface of the multilayer board. The extended electrode is electrically connected to the inner-layer ground electrode in the multilayer board and at least a portion of the extended electrode overlaps the inner-layer ground electrode when viewed in a lamination direction of the multilayer board. An end portion of the extended electrode is exposed at the side surface of the multilayer board and connected to the shield electrode. An end portion of the inner-layer ground electrode is exposed at the side surface of the multilayer board and connected to the shield electrode.

Since the end portions of both of the inner-layer ground electrode and the extended electrode are exposed at the side surface of the multilayer board and connected to the shield electrode, the connection reliability between the shield electrode and the inner-layer ground electrode is increased.

The multilayer board may include one or more patterned wires in an inner layer of the multilayer board, the patterned wires defining a predetermined circuit together with the mounting component. The end portion of the extended electrode may be connected to the shield electrode at a side of the multilayer board adjacent to a portion in which a density of the patterned wires is lower than in other portions when viewed in the lamination direction.

The side of the multilayer board adjacent to the portion in which the density of the patterned wires is lower than that in other portions is particularly easily warped or distorted. When the end portion of the extended electrode is connected to the shield electrode at this side, the extended electrode is disposed near this side. Therefore, the occurrence of warping and distortion of the side end portion of the multilayer board, which is easily warped or distorted, is reduced. More specifically, since the extended electrode is provided, variation in the density of patterned electrodes in the multilayer board is reduced, and the density is more uniform. As a result, warping and distortion of the multilayer board are reduced or prevented. In other words, the occurrence of warping and distortion of a portion of the multilayer board that is easily warped and distorted is effectively reduced or prevented.

The extended electrode may be disposed directly on the inner-layer ground electrode.

In this case, the parasitic inductance between the inner-layer ground electrode and the extended electrode is lower than that in the case in which the inner-layer ground electrode is connected to the extended electrode through, for example, a via. Therefore, the extended electrode defines and functions as an electrically reliable ground electrode, and the shielding function of the shield electrode is able to be further improved.

A plurality of the extended electrodes may be disposed in the same layer of the multilayer board.

When a plurality of the extended electrodes are disposed in the same layer of the multilayer board, the total contact area between the shield electrode and the extended electrodes is large. Accordingly, the connection reliability between the shield electrode and the inner-layer ground electrode is further increased.

The extended electrode may include an upper extended electrode disposed above the inner-layer ground electrode and a lower extended electrode disposed below the inner-layer ground electrode.

Thus, the extended electrode may include electrodes disposed in a plurality of layers (the upper extended electrode and the lower extended electrode). In this case, the occurrence of warping and distortion of the side end portion of the multilayer board, which is easily warped or distorted, is further reduced or prevented. Accordingly, the connection reliability between the shield electrode and the inner-layer ground electrode is further increased. In addition, since the extended electrodes (the upper extended electrode and the lower extended electrode) are disposed above and below the inner-layer ground electrode, the connection reliability between the shield electrode and the inner-layer ground electrode is increased irrespective of the manner in which the multilayer board is warped or distorted.

The upper extended electrode and the lower extended electrode may be alternately arranged along a side of the multilayer board when viewed in the lamination direction.

In this case, the thickness of the extended electrodes in the lamination direction is uniform or substantially uniform. Accordingly, warping and distortion of the multilayer board are further reduced or prevented.

The multilayer board may further include a barium aluminum silicate (BAS) paste layer disposed at a position at which the BAS paste layer does not overlap the extended electrode when viewed in the lamination direction.

When the dummy electrode is provided, conductors are able to be more evenly distributed over the multilayer board and the distribution thereof is more uniform. Accordingly, warping and distortion of the multilayer board are further reduced or prevented.

The multilayer board may further include a BAS paste layer disposed at a position at which the BAS paste layer does not overlap the extended electrode when viewed in the lamination direction.

When the BAS paste layer is provided, the thickness of the multilayer board is more uniform, and warping and distortion are further reduced or prevented.

The inner-layer ground electrode may extend over the entire or substantially the entire area of the multilayer board when viewed in the lamination direction.

In such a case, the layout flexibility of the extended electrode, which includes at least a portion thereof that overlaps the inner-layer ground electrode, is increased.

The extended electrode may be disposed only in an end portion of the multilayer board when viewed in the lamination direction.

In such a case, warping and distortion of the multilayer board are reduced or prevented without greatly increasing the overall thickness of the multilayer board.

Preferred embodiments of the present invention provide circuit modules each including an inner-layer ground electrode and a shield electrode that are able to be connected with increased connection reliability.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
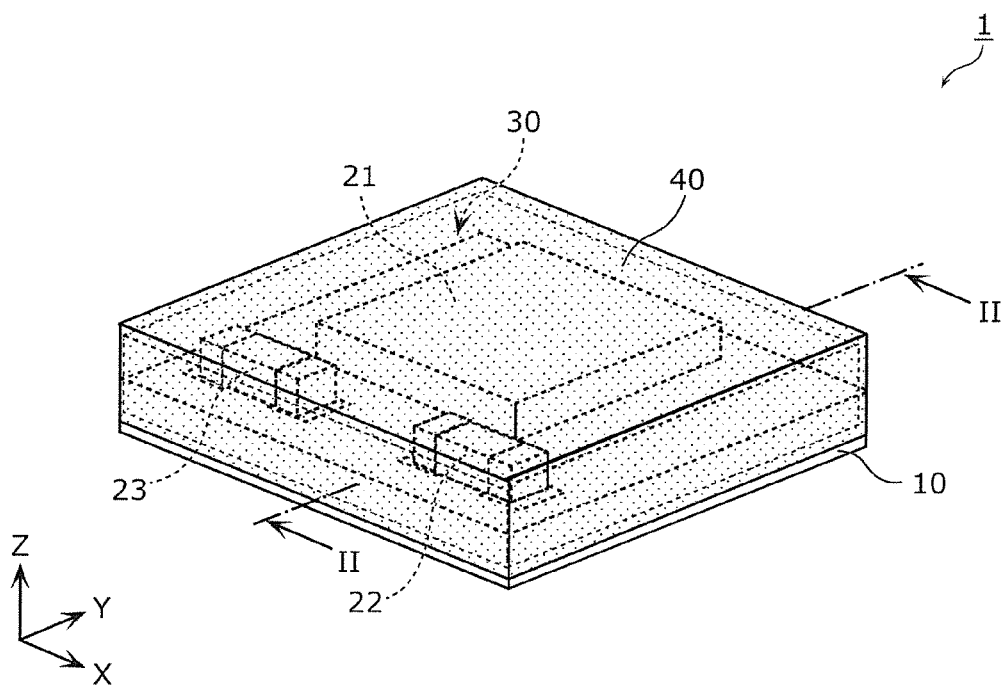
FIG. 1 is a perspective view of a circuit module according to a first preferred embodiment of the present invention.

Circuit modules according to preferred embodiments of the present invention will now be described with reference to the drawings. Each of the preferred embodiments described below is a preferred example of the present invention. Numerical values, shapes, materials, locations, and connection structures of components, manufacturing processes, and the order in which the manufacturing processes are performed in the preferred embodiments are examples, and are not intended to limit the scope of the present invention. Among the components mentioned in the preferred embodiments described below, components that are not mentioned in the independent claim, which is the broadest, are optional components.

The drawings are schematic, and are not strictly accurate in dimension or detail. In the drawings, components having the same or substantially the same structures are denoted by the same reference signs, and redundant descriptions may be omitted or simplified. In sectional views illustrating the preferred embodiments described below, components on different sectional planes in practice may be shown on the same drawing to facilitate understanding.

First Preferred Embodiment

FIG. 1 is a perspective view of a circuit module 1 according to a first preferred embodiment of the present invention.

In FIG. 1, a thickness direction of the circuit module 1 (that is, a lamination direction of a multilayer board 10) is referred to as the Z-axis direction, and directions perpendicular or substantially perpendicular to the Z-axis direction and perpendicular or substantially perpendicular to each other are referred to as the X-axis and Y-axis directions. Also, the side of the circuit module 1 in the positive Z-axis direction is referred to as the top (upper) side of the circuit module 1. However, when used in practice, the circuit module 1 is not always positioned such that the thickness direction thereof is vertical. Therefore, the top side of the circuit module 1 is not limited to the upper side when the circuit module 1 is used in practice. In the following description, the expression "viewed in the lamination direction" means that an object is viewed in the lamination direction of the multilayer board 10 (in the direction parallel or substantially parallel to the Z-axis).

The circuit module 1 is, for example, a module component that defines a predetermined circuit, such as a front-end circuit. As illustrated in FIG. 1, the circuit module 1 includes a multilayer board 10, mounting components 21 to 23 mounted on the multilayer board 10, a resin 30 that covers the mounting components 21 to 23, and a shield electrode 40 that covers the resin 30 and at least portions of the side surfaces of the multilayer board 10.

Components of the circuit module 1 will now be described in detail with reference to FIG. 2.

Figure 2:
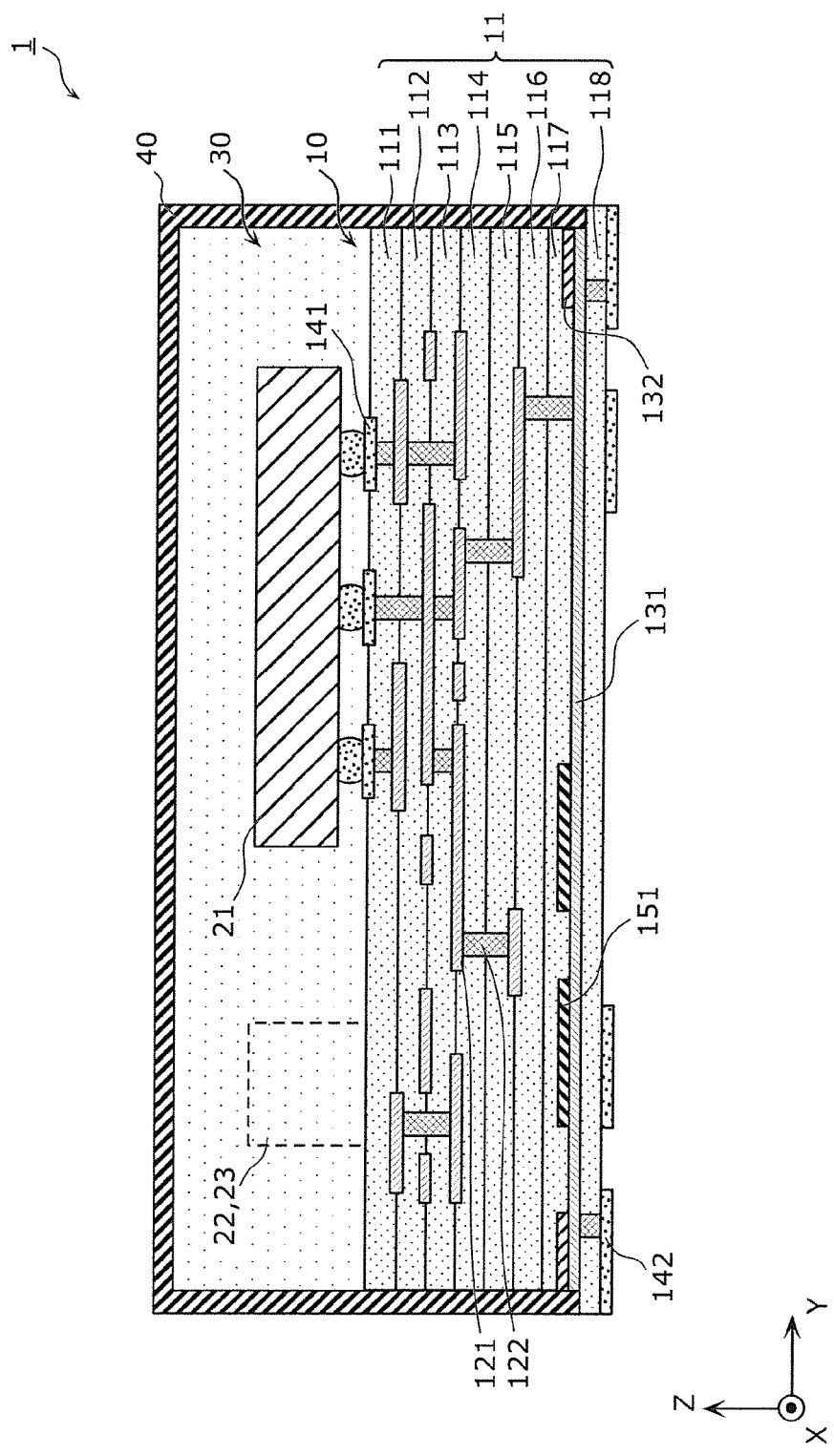
FIG. 2 is a sectional view of the circuit module according to the first preferred embodiment of the present invention.

FIG. 2 is a sectional view of the circuit module 1 according to the first preferred embodiment. More specifically, FIG. 2 is a sectional view taken along line II-II in FIG. 1.

The multilayer board 10 includes a laminate body 11 including base material layers 111 and 118 and various conductors disposed on the base material layers 111 and 118. The various conductors include patterned wires 121, which are conductors provided along the principal surfaces of the base material layers 111 and 118 (along the XY plane), and vias 122, which are conductors extending through the base material layers 111 and 118 in the thickness direction (Z-axis direction).

An inner-layer ground electrode 131 and extended electrodes 132 that extend from the inner-layer ground electrode 131 are disposed in an inner layer of the multilayer board 10 (that is, in an inner layer of the laminate body 11). The inner-layer ground electrode 131 and the extended electrodes 132 will be described in detail below. When a component is described herein as being "disposed in an inner layer of the multilayer board 10", it means that the component is vertically sandwiched by the base material layers and is not exposed at the upper or lower surface of the multilayer board 10.

Surface electrodes 141 used to mount the mounting components 21 to 23 are provided on the upper surface of the multilayer board 10, and surface electrodes 142 used to mount the circuit module 1 on, for example, a mother board are provided on the lower surface of the multilayer board 10.

In addition, in the present preferred embodiment, dummy electrodes 151 are additionally disposed in an inner layer of the multilayer board 10. The dummy electrodes 151 are, for example, independent electrodes that are not connected to other electrodes, or electrodes connected only to the inner-layer ground electrode 131. In other words, the dummy electrodes 151 are electrodes that do not change the circuit structure of the predetermined circuit defined by the circuit module 1. In the present preferred embodiment, the dummy electrodes 151 are disposed directly on the inner-layer ground electrode 131. The dummy electrodes 151 will be described in detail below together with the inner-layer ground electrode 131 and the extended electrodes 132.

The material of the multilayer board 10 is not particularly limited. For example, the base material layers 111 and 118 may preferably be made of, for example, a ceramic material, such as low temperature co-fired ceramics (LTCC), or a resin, such as polyimide. The conductors (the patterned wires 121, the vias 122, the inner-layer ground electrode 131, the extended electrodes 132, the surface electrodes 141 and 142, and the dummy electrodes 151) may preferably be made of, for example, silver or copper.

The method for forming the multilayer board 10 is not particularly limited. For example, when the base material layers 111 and 118 are made of LTCC, the multilayer board 10 may be formed by applying silver or copper conductive paste for forming the conductors to ceramic green sheets by screen printing, and then performing simultaneous firing.

The mounting components 21 to 23 define a predetermined circuit together with the various conductors provided in the multilayer board, and may each be, for example, a switch integrated circuit (IC), a filter, a duplexer, an oscillator, a chip capacitor, or a chip inductor. The mounting components 21 to 23 are not limited to land grid array (LGA) or ball grid array (BGA) components, and may instead be components mounted by wire bonding.

The resin 30 defines a sealing member that covers and seals the mounting components 21 to 23. In the present preferred embodiment, the resin 30 extends over the entire or substantially the entire upper surface of the multilayer board 10 so as to cover the mounting components 21 to 23. The resin 30 may instead be provided so that it does not cover a portion of the upper surface of the multilayer board 10.

The material of the resin 30 is not particularly limited, and may preferably be, for example, an epoxy resin. The method for forming the resin 30 is not particularly limited. For example, when a liquid resin is used, the resin 30 may be formed by applying the liquid resin to the upper surface of the multilayer board 10 by using a dispenser or the like so that the mounting components 21 to 23 are covered, and then heating and solidifying the liquid resin. When a solid resin is used, the resin 30 may be formed by placing a predetermined amount of solid resin on the upper surface of the multilayer board 10, heating and melting the solid resin, and then solidifying the resin.

The shield electrode 40 covers the resin 30 and at least portions of the side surfaces of the multilayer board 10. In the present preferred embodiment, the shield electrode 40 covers the outer surfaces of the resin 30 and the side surfaces of the multilayer board 10 over the entire or substantially the entire areas thereof. More specifically, the shield electrode 40 covers the upper and side surfaces of the resin 30 and the side surfaces of the base material layers 111 to 117 of the multilayer board 10. The shield electrode 40 is connected at least to the extended electrodes 132 at the side surfaces of the multilayer board 10. Accordingly, the shield electrode 40 performs a shielding function to reduce radiation from the circuit module 1 to the outside. In the present preferred embodiment, the shield electrode 40 is connected to the inner-layer ground electrode 131 and the extended electrodes 132 at all of the side surfaces of the multilayer board 10.

The material of the shield electrode 40 is not particularly limited, and may preferably be, for example, silver. The method for forming the shield electrode 40 is not particularly limited. For example, the shield electrode 40 may be formed by the following method. First, an assembly including the multilayer board 10 on which the mounting components 21 to 23 are mounted and the resin 30 is half-cut (the base material layers 111 to 117 are cut while the base material layer 118 is left uncut), so that the inner-layer ground electrode 131 and the extended electrodes 132 are exposed at the side surfaces of the multilayer board 10. Next, the shield electrode 40 that is conductively connected to the inner-layer ground electrode 131 and the extended electrodes 132 at the side surfaces of the multilayer board 10 is formed by applying conductive paste made of silver, for example, to the side surfaces of the multilayer board 10 and the resin 30 or by sputtering or deposition.

In the above-described step of cutting the assembly, the assembly including the multilayer board 10 on which the mounting components 21 to 23 are mounted and the resin 30 may instead be cut entirely (the base material layers 111 and 118 may all be cut). In other words, the shield electrode 40 may instead cover the side surfaces of the base material layers 111 and 118 of the multilayer board 10.

The inner-layer ground electrode 131 and the extended electrodes 132 will now be described in detail together with the dummy electrodes 151.

The inner-layer ground electrode 131 is disposed in an inner layer of the multilayer board 10. In the present preferred embodiment, the inner-layer ground electrode 131 is a solid patterned electrode that extends over the entire or substantially the entire area of the multilayer board 10 when viewed in the lamination direction. The expression "the entire or substantially the entire area" means not only completely the entire area but also virtually the entire area. In other words, the inner-layer ground electrode 131 may be provided so as to leave local areas in which the inner-layer ground electrode 131 is not provided to avoid the vias 122 having a potential other than the ground potential along a plane perpendicular or substantially perpendicular to the lamination direction.

In the present preferred embodiment, end portions of the inner-layer ground electrode 131 are exposed at the side surfaces of the multilayer board 10 and are connected to the shield electrode 40. In other words, the inner-layer ground electrode 131 and the shield electrode 40 are conductively connected to each other. More specifically, when viewed in the lamination direction, all of the end portions along the periphery of the inner-layer ground electrode 131 (that is, all four sides of the inner-layer ground electrode 131) are exposed at the side surfaces of the multilayer board 10.

It is not necessary that all of the end portions of the inner-layer ground electrode 131 along the periphery be exposed when viewed in the lamination direction. For example, the end portions may be exposed at two opposing sides or two adjacent sides of the multilayer board 10 when viewed in the lamination direction. In other words, the inner-layer ground electrode 131 is not limited to a solid patterned electrode, and may instead be an electrode that extends to two different side surfaces of the multilayer board 10.

The extended electrodes 132 are ground electrodes that extend from the inner-layer ground electrode 131, and are disposed in an inner layer of the multilayer board 10. The extended electrodes 132 are electrically connected to the inner-layer ground electrode 131 in the multilayer board 10, and are arranged so that at least portions thereof overlap the inner-layer ground electrode 131 when viewed in the lamination direction of the multilayer board 10. In the present preferred embodiment, the inner-layer ground electrode 131 is preferably a solid patterned electrode. Therefore, when viewed in the lamination direction, the extended electrodes 132 overlap the inner-layer ground electrode 131 over the entire or substantially the entire areas thereof.

End portions of the extended electrodes 132 are exposed at the side surfaces of the multilayer board 10 and are connected to the shield electrode 40. In other words, the extended electrodes 132 extend from the inner-layer ground electrode 131 to the side surfaces of the multilayer board 10.

In the present preferred embodiment, the extended electrodes 132 are disposed directly on the inner-layer ground electrode 131. Accordingly, the extended electrodes 132 are conductively connected to the inner-layer ground electrode 131 with no vias 122 provided therebetween. More specifically, the extended electrodes 132 are disposed above the inner-layer ground electrode 131 (in the positive Z-axis direction), and are disposed directly on the inner-layer ground electrode 131 (on the upper surface of the inner-layer ground electrode 131 in the present preferred embodiment).

In addition, in the present preferred embodiment, the extended electrodes 132 are disposed in the same layer of the multilayer board 10. More specifically, as illustrated in FIG. 2, the extended electrodes 132 are disposed between the base material layer 117 and the base material layer 118 of the multilayer board 10.

Figure 3:
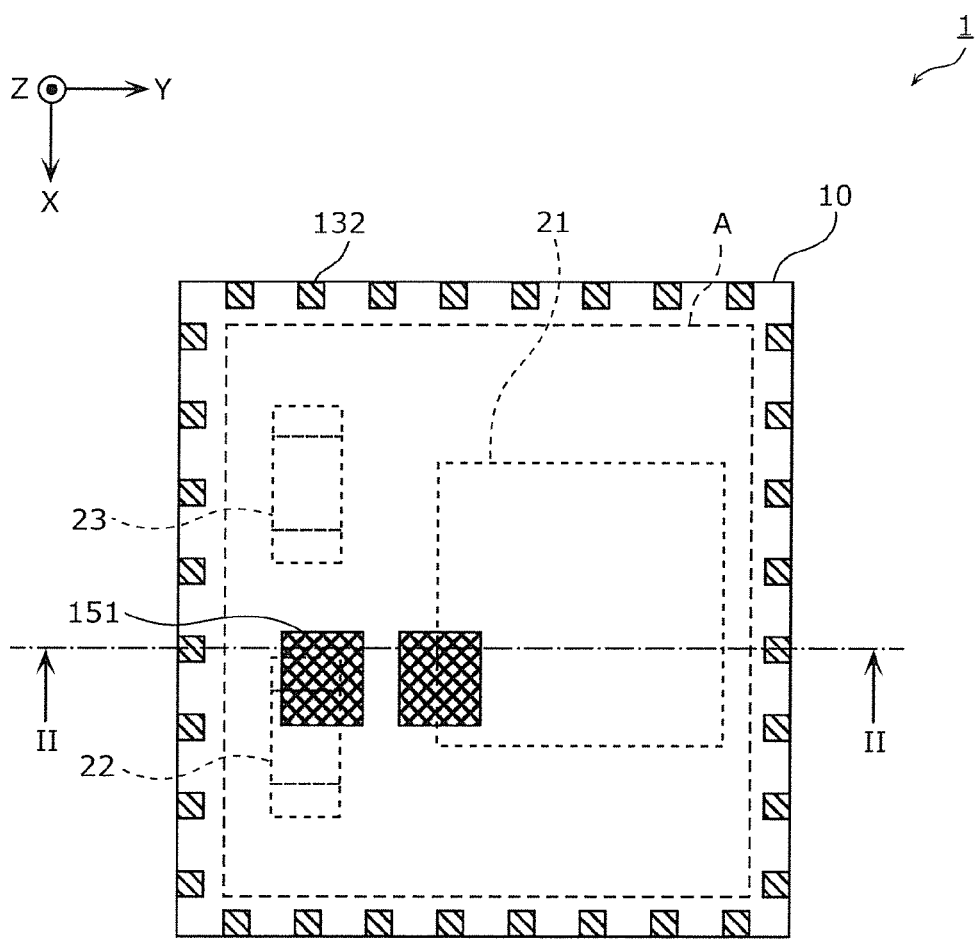
FIG. 3 is a layout diagram illustrating the arrangement of extended electrodes in the circuit module according to the first preferred embodiment of the present invention.

FIG. 3 is a layout diagram illustrating the arrangement of the extended electrodes 132 in the circuit module 1 according to the first preferred embodiment. FIG. 3 also illustrates the arrangement of the dummy electrodes 151. To facilitate understanding, the extended electrodes 132 and the dummy electrodes 151 are shaded in FIG. 3. This also applies to other layout diagrams described below.

FIG. 3 illustrates a region A that is a portion in which the density of the patterned wires 121 is relatively high. In other words, when viewed in the lamination direction, the region of the multilayer board 10 excluding the region A is a portion in which the density of the patterned wires 121 is lower than in region A.

The region A is, for example, a region that may be determined based on the distribution of the patterned wires 121 in the multilayer board 10 and in which the ratio of the thickness of the patterned wires 121 to the thickness of the multilayer board 10 is greater than or equal to a predetermined value (for example, the average). The region A may instead be a region determined as appropriate based on, for example, the design of the multilayer board 10, or a region in which the patterned wires 121 are able to be provided and that is limited by, for example, the circuit characteristics and strength required of the multilayer board 10.

As illustrated in FIG. 3, in the present preferred embodiment, the extended electrodes 132 are disposed only in the end portions of the multilayer board 10 when viewed in the lamination direction. In addition, when viewed in the lamination direction, the end portions of the extended electrodes 132 are connected to the shield electrode 40 at the sides of the multilayer board 10 adjacent to the portions in which the density of the patterned wires 121 is lower than that in other portions (that is, in the region excluding the region A). More specifically, as illustrated in FIG. 3, since the region A is at a central portion of the multilayer board 10, the density of the patterned wires 121 is low at the peripheral end portions of the multilayer board 10. Accordingly, the end portions of the extended electrodes 132 are connected to the shield electrode 40 at the sides adjacent to the peripheral portions (four sides in this example}.

The extended electrodes 132 may be at least partially disposed in the portion in which the density of the patterned wires 121 is high (that is, in the region A in FIG. 3) as long as the extended electrodes 132 are connected to the shield electrode 40 at the sides of the multilayer board 10 adjacent to the portions in which the density of the patterned wires 121 is low. The sides adjacent to the portions in which the density of the patterned wires 121 is low are the sides closest to the portions in which the density is low, in particular, the sides that extend along the portions in which the density is low.

In the present preferred embodiment, the extended electrodes 132 are preferably disposed at, for example, equal or substantially equal intervals along the sides of the multilayer board 10 when viewed in the lamination direction. The intervals at which the extended electrodes 132 are arranged are not particularly limited, and may be determined as appropriate to reduce warping and distortion of the multilayer board 10. The intervals of the extended electrodes 132 are not limited to equal or substantially equal intervals, and may instead be, for example, reduced as the density of the patterned wires 121 is reduced.

The dummy electrodes 151 do not overlap the extended electrodes 132 when viewed in the lamination direction. The locations of the dummy electrodes 151 are not particularly limited as long as the dummy electrodes 151 do not overlap the extended electrodes 132. However, to reduce warping and distortion of the multilayer board 10, the dummy electrodes 151 are preferably disposed in portions in which the density of the patterned wires 121 is low when viewed in the lamination direction. For example, the dummy electrodes 151 are preferably disposed in portions of the region A in which the density of the patterned wires 121 is relatively low.

According to the circuit module 1 of the present preferred embodiment having the above-described structure, the connection reliability between the shield electrode 40 and the inner-layer ground electrode 131 is higher than that in a circuit module according to a comparative example that includes no extended electrodes 132.

More specifically, in the circuit module according to the comparative example, the multilayer board may be warped or distorted when heated because the base material layers made of a resin or a ceramic material and the conductors, such as the patterned wires, made of silver or copper have different coefficients of thermal contraction. When the shield electrode is disposed to be connected to the inner-layer ground electrode at the side surfaces of the multilayer board that is warped or distorted, a connection failure easily occurs between the shield electrode and the inner-layer ground electrode. Thus, the connection reliability between the shield electrode and the inner-layer ground electrode is reduced.

In contrast, in the circuit module 1 according to the present preferred embodiment, the end portions of both of the inner-layer ground electrode 131 and the extended electrodes 132 are exposed at the side surfaces of the multilayer board 10 and connected to the shield electrode 40.

Accordingly, the connection reliability between the shield electrode 40 and the inner-layer ground electrode 131 is increased.

In the circuit module 1 according to the present preferred embodiment, when viewed in the lamination direction, the end portions of the extended electrodes 132 are connected to the shield electrode 40 at the sides of the multilayer board 10 adjacent to the portions in which the density of the patterned wires 121 is lower than that in other portions.

The sides of the multilayer board 10 adjacent to the portions in which the density of the patterned wires 121 is lower than that in other portions are particularly easily warped or distorted due to the difference in coefficient of thermal contraction. Since the end portions of the extended electrodes 132 are connected to the shield electrode 40 at these sides, the extended electrodes 132 are disposed near these sides. Therefore, the occurrence of warping and distortion of the side end portions of the multilayer board 10, which are easily warped or distorted, is reduced. More specifically, since the extended electrodes 132 are provided, variation in the density of patterned electrodes in the multilayer board 10 is reduced, and the density is uniform or substantially uniform. As a result, warping and distortion of the multilayer board 10 are reduced or prevented. In other words, the occurrence of warping and distortion of portions of the multilayer board 10 that are easily warped and distorted is effectively reduced or prevented.

In the circuit module 1 according to the present preferred embodiment, the extended electrodes 132 are disposed directly on the inner-layer ground electrode 131.

Therefore, the parasitic inductance between the inner-layer ground electrode 131 and the extended electrodes 132 is lower than that in the case in which the inner-layer ground electrode 131 is connected to the extended electrodes 132 through, for example, the vias 122. Therefore, the extended electrodes 132 define and function as electrically reliable ground electrodes, and the shielding function of the shield electrode 40 is further enhanced.

In the circuit module 1 according to the present preferred embodiment, the extended electrodes 132 are disposed in the same layer of the multilayer board 10. Therefore, the total contact area between the shield electrode 40 and the extended electrodes 132 is large. Accordingly, the connection reliability between the shield electrode 40 and the inner-layer ground electrode 131 is further increased.

The circuit module 1 according to the present preferred embodiment includes the dummy electrodes 151. Therefore, conductors are able to be more evenly distributed over the multilayer board 10 and the distribution thereof is more uniform. Accordingly, warping and distortion of the multilayer board 10 are further reduced or prevented.

In the circuit module 1 according to the present preferred embodiment, the inner-layer ground electrode 131 extends over the entire or substantially the entire area of the multilayer board 10 when viewed in the lamination direction. Therefore, the layout flexibility of the extended electrodes 132, which are disposed so that at least portions thereof overlap the inner-layer ground electrode 131, is increased.

In the circuit module 1 according to the present preferred embodiment, the extended electrodes 132 are disposed only in the end portions of the multilayer board 10 when viewed in the lamination direction. Therefore, warping and distortion of the multilayer board 10 are reduced without greatly increasing the overall thickness of the multilayer board 10.

First Modification of First Preferred Embodiment

It is not necessary that the extended electrodes be disposed directly on the inner-layer ground electrode 131, and may instead be, for example, connected to the inner-layer ground electrode 131 through the vias 122.

Figure 4:
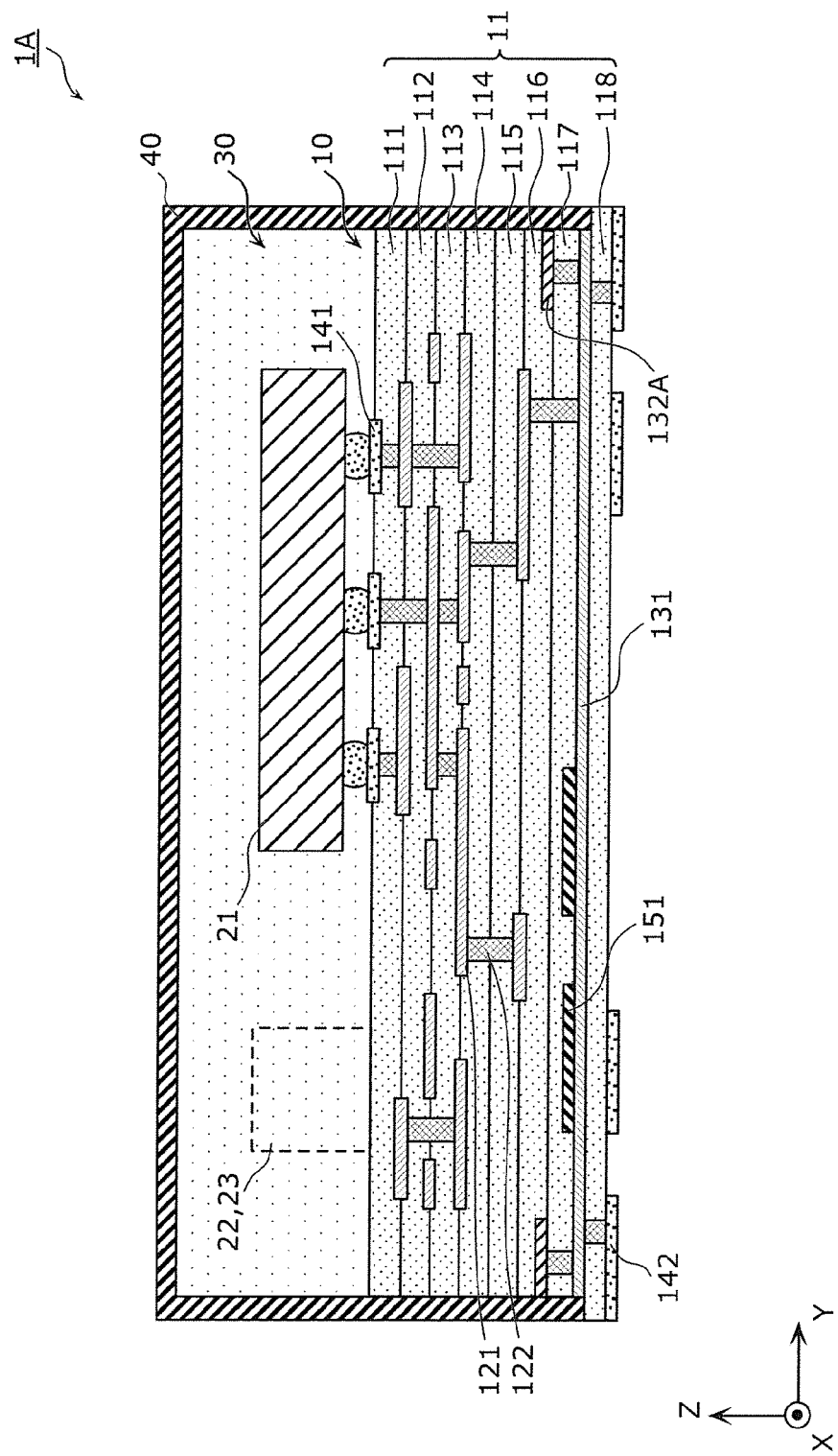
FIG. 4 is a sectional view of a circuit module according to a first modification of the first preferred embodiment of the present invention.

FIG. 4 is a sectional view of a circuit module 1A according to a first modification of the first preferred embodiment of the present invention. The circuit module 1A illustrated in FIG. 4 differs from the circuit module 1 illustrated in FIG. 2 in that extended electrodes 132A are connected to the inner-layer ground electrode 131 through the vias 122.

Also in the circuit module 1A having such a structure, similar to the above-described first preferred embodiment, the end portions of both of the inner-layer ground electrode 131 and the extended electrodes 132A are exposed at the side surfaces of the multilayer board 10 and connected to the shield electrode 40. Accordingly, the connection reliability between the shield electrode 40 and the inner-layer ground electrode 131 is increased.

Second Modification of First Preferred Embodiment

Although the extended electrodes 132 are disposed at equal or substantially equal intervals along the sides of the multilayer board 10 when viewed in the lamination direction in the above-described first preferred embodiment, the arrangement of the extended electrodes 132 is not limited to this.

Figure 5:
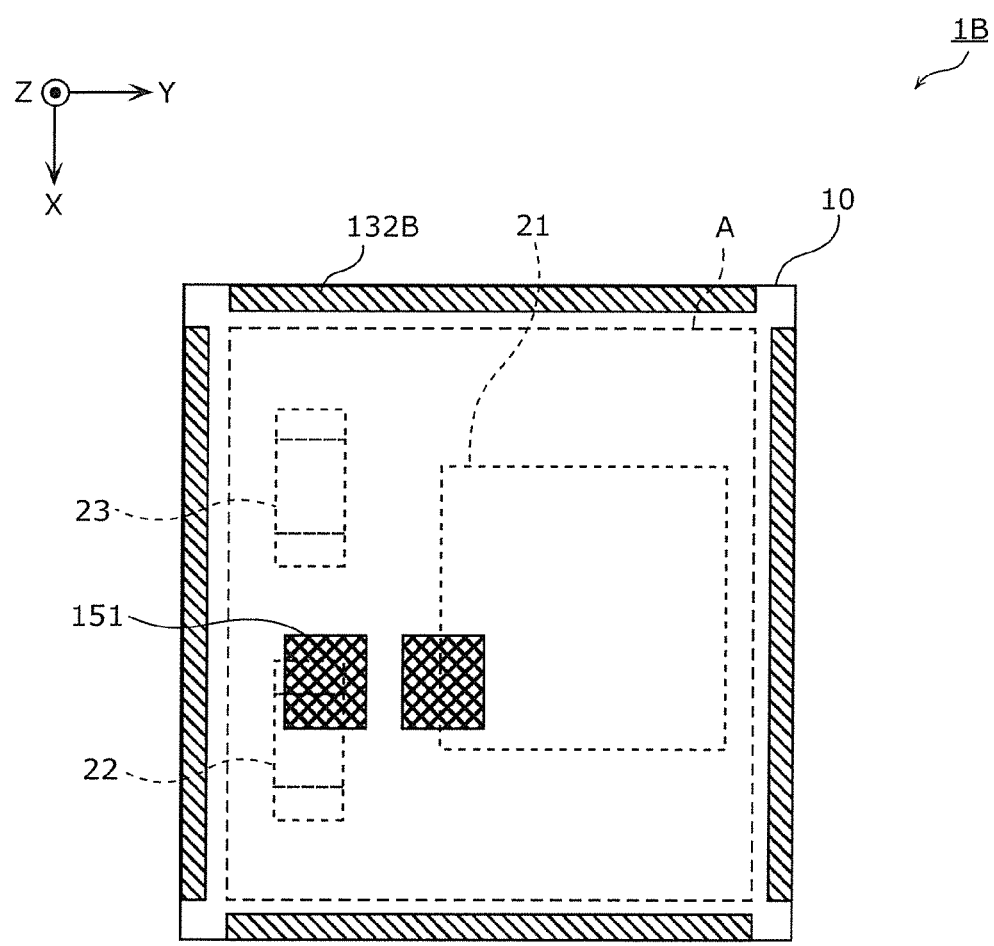
FIG. 5 is a layout diagram illustrating the arrangement of extended electrodes in a circuit module according to a second modification of the first preferred embodiment of the present invention.

FIG. 5 is a layout diagram illustrating the arrangement of extended electrodes 132B in a circuit module 1B according to a second modification of the first preferred embodiment of the present invention. The extended electrodes 132B differ from the extended electrodes 132 illustrated in FIG. 3 in that the extended electrodes 132B extend along the sides of the multilayer board 10 when viewed in the lamination direction.

Also in the circuit module 1B having such a structure, similar to the above-described first preferred embodiment, the end portions of both the inner-layer ground electrode 131 and the extended electrodes 132B are exposed at the side surfaces of the multilayer board 10 and connected to the shield electrode 40. Accordingly, the connection reliability between the shield electrode 40 and the inner-layer ground electrode 131 is increased.

Although the extended electrodes 132B are independently disposed along the respective sides of the multilayer board 10 when viewed in the lamination direction in the present modification, the arrangement thereof is not limited to this. For example, an extended electrode may, instead, extend continuously along two adjacent sides of the multilayer board 10, or have a closed shape along the sides of the multilayer board 10.

Third Modification of First Preferred Embodiment

A BAS paste layer may be additionally disposed in an inner layer of the multilayer board 10.

Figure 6:
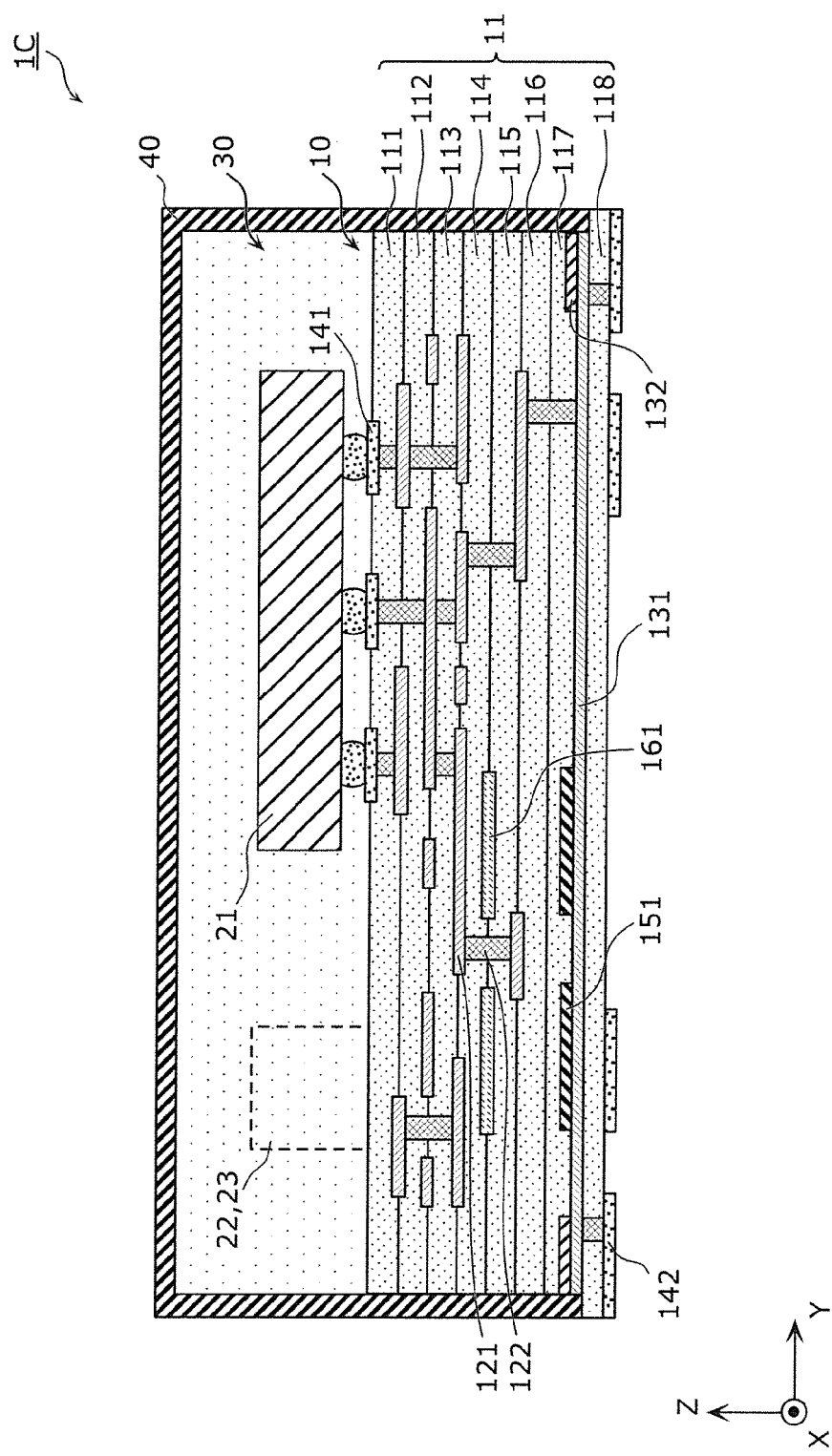
FIG. 6 is a sectional view of a circuit module according to a third modification of the first preferred embodiment of the present invention.

FIG. 6 is a sectional view of a circuit module 1C according to a third modification of the first preferred embodiment of the present invention.

The circuit module 1C illustrated in FIG. 6 differs from the circuit module 1 illustrated in FIG. 2 in that the multilayer board 10 additionally includes a BAS paste layer 161 that does not overlap the extended electrodes 132 when viewed in the lamination direction.

In the third modification, the BAS paste layer 161 is an insulator layer disposed in a layer different from the layer in which the inner-layer ground electrode 131 is disposed, and includes portions having the same or substantially the same shapes and disposed at the same or substantially the same positions as the dummy electrodes 151 when viewed in the lamination direction. The shape and location of the BAS paste layer 161 are not particularly limited as long as the BAS paste layer 161 does not overlap the extended electrodes 132 when viewed in the lamination direction. To reduce warping and distortion of the multilayer board 10, the BAS paste layer 161 is preferably disposed in a portion in which the density of the patterned wires 121 is low when viewed in the lamination direction. For example, the BAS paste layer 161 is preferably disposed in a portion of the region A (see FIG. 3) in which the density of the patterned wires 121 is relatively low.

The material of the BAS paste layer 161 is not particularly limited. For example, a dielectric material (BAS material) including barium (Ba), aluminum (Al), and silicon (Si) as the main components thereof may preferably be used.

Also in the circuit module 1C having such a structure, similar to the above-described first preferred embodiment, the end portions of both of the inner-layer ground electrode 131 and the extended electrodes 132 are exposed at the side surfaces of the multilayer board 10 and connected to the shield electrode 40. Accordingly, the connection reliability between the shield electrode 40 and the inner-layer ground electrode 131 is increased.

In addition, in the circuit module 1C according to the present modification, since the multilayer board 10 includes the BAS paste layer 161, the overall thickness of the multilayer board 10 is uniform or substantially uniform. More specifically, the overall thickness of the multilayer board 10 varies depending on the distribution of the conductors in the multilayer board 10, and is large in regions in which the density of the conductors is high and small in regions in which the density is low. The multilayer board 10 is particularly easily distorted in regions at which the thickness thereof is small. Therefore, by providing the BAS paste layer 161 in the portion in which the density of the conductors is low, the thickness of the multilayer board 10 is able to be made uniform or substantially uniform, and warping and distortion of the multilayer board 10 are further reduced or prevented.

Second Preferred Embodiment

In the above-described first preferred embodiment and modifications thereof, the extended electrodes are provided in only one layer of the multilayer board 10. However, the extended electrodes may instead be provided in a plurality of layers of the multilayer board 10. In addition, although the dummy electrodes 151 are disposed in the multilayer board 10 in the above-described first preferred embodiment and modifications thereof, the dummy electrodes 151 may be omitted. A circuit module having such a structure will now be described as a circuit module according to a second preferred embodiment of the present invention.

Figure 7:
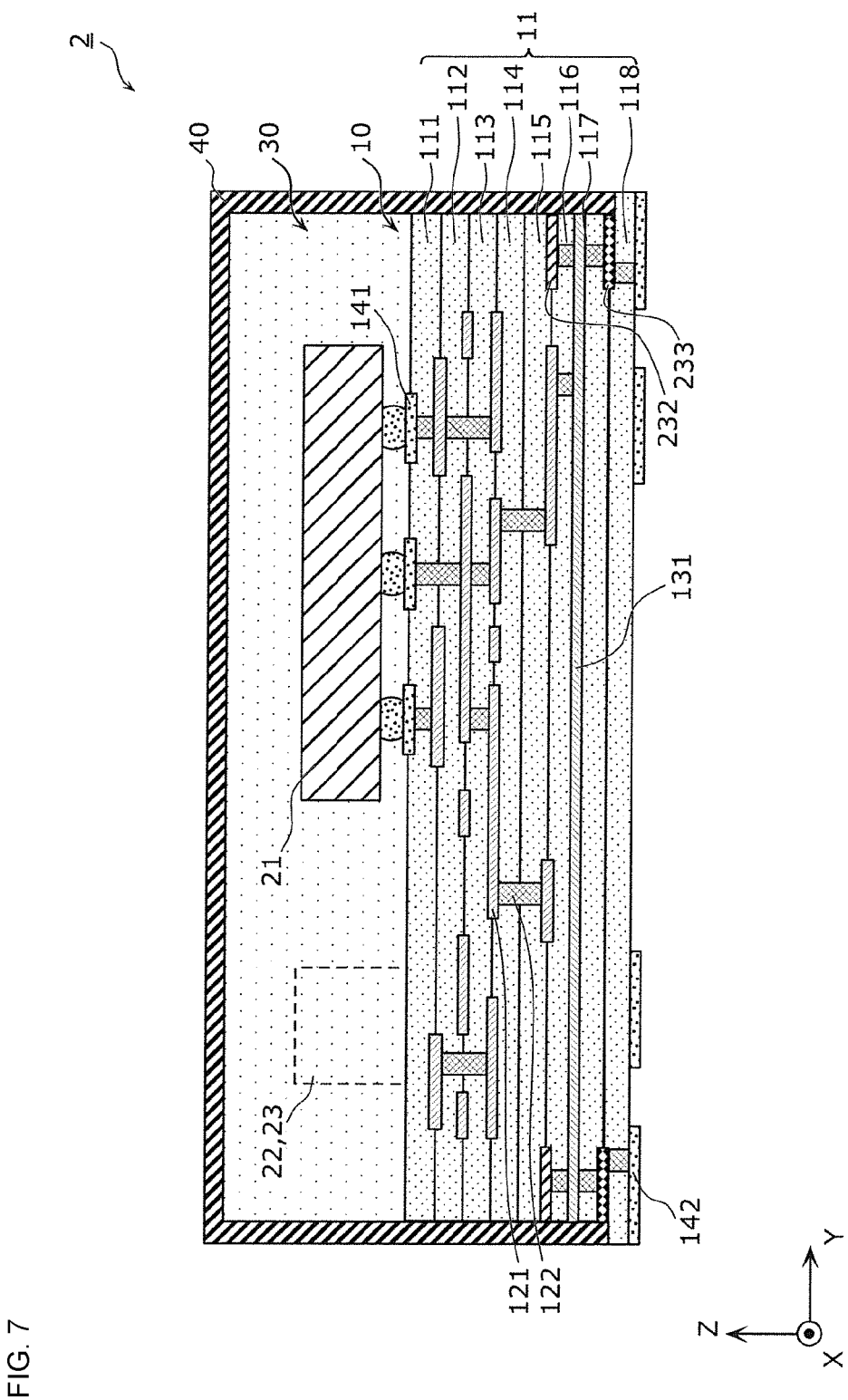
FIG. 7 is a sectional view of a circuit module according to a second preferred embodiment of the present invention.

FIG. 7 is a sectional view of a circuit module 2 according to the second preferred embodiment.

The circuit module 2 illustrated in FIG. 7 differs from the circuit module 1A illustrated in FIG. 4 in that upper extended electrodes 232 and lower extended electrodes 233 are provided, instead of the extended electrodes 132A, and that the dummy electrodes 151 are not provided. The upper extended electrodes 232 correspond to the extended electrodes 132A. Accordingly, the lower extended electrodes 233 will be mainly described, and description of the upper extended electrodes 232 will be simplified as appropriate.

Although the inner-layer ground electrode 131 and the upper extended electrodes 232 of the circuit module 2 are disposed in layers different from those in the circuit module 1A, they may instead be disposed in the same layers as those in the circuit module 1A.

The lower extended electrodes 233 are disposed below the inner-layer ground electrode 131. In the present preferred embodiment, the lower extended electrodes 233 are connected to the inner-layer ground electrode 131 through the vias 122. The lower extended electrodes 233 may, instead, be disposed directly on the inner-layer ground electrode 131 (on the lower surface of the inner-layer ground electrode 131 in the negative Z-axis direction in this case) instead of being connected through the vias 122.

Figure 8:
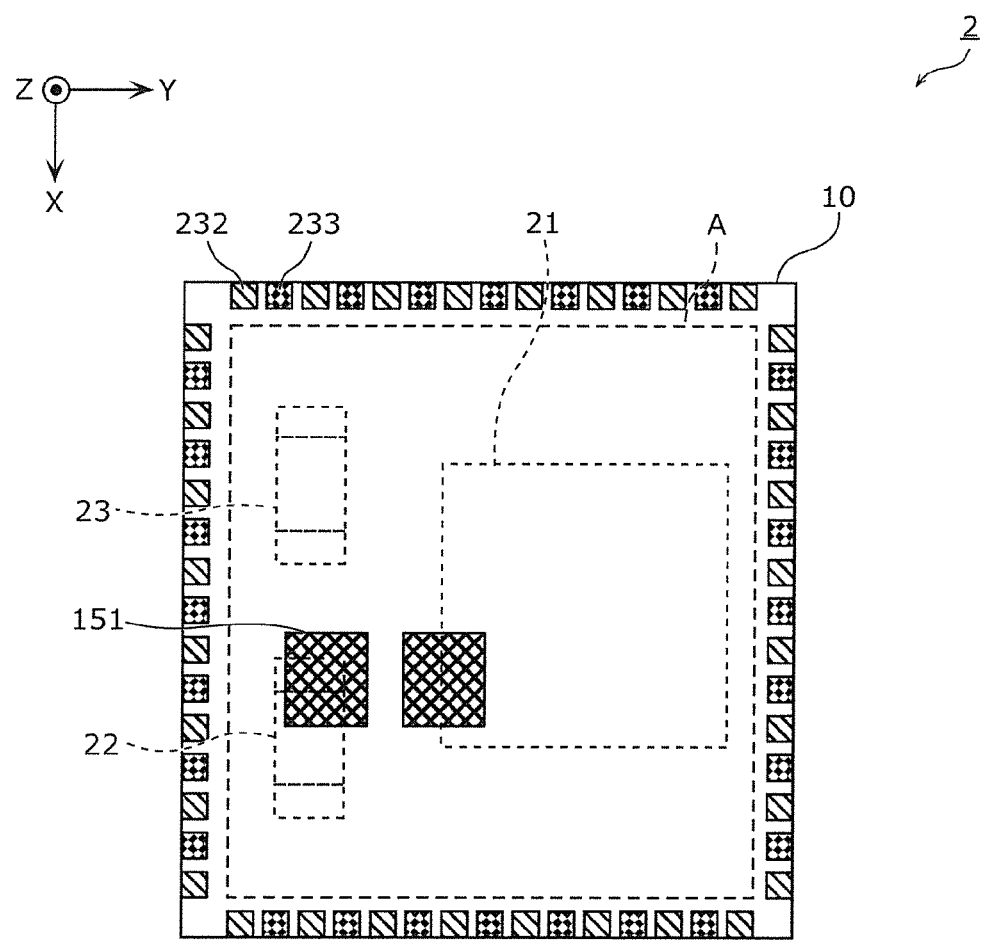
FIG. 8 is a layout diagram illustrating the arrangement of upper extended electrodes and lower extended electrodes in the circuit module according to the second preferred embodiment of the present invention.

The upper extended electrodes 232 and the lower extended electrodes 233 are arranged as illustrated in FIG. 8 in the present preferred embodiment.

FIG. 8 is a layout diagram illustrating the arrangement of the upper extended electrodes 232 and the lower extended electrodes 233 in the circuit module 2 according to the second preferred embodiment.

As illustrated in FIG. 8, when viewed in the lamination direction, the upper extended electrodes 232 and the lower extended electrodes 233 do not overlap each other. More specifically, the upper extended electrodes 232 and the lower extended electrodes 233 are arranged alternately along the sides of the multilayer board 10. For example, the upper extended electrodes 232 and the lower extended electrodes 233 preferably have the same or substantially the same shape and size. The upper extended electrodes 232 and the lower extended electrodes 233 may instead have different shapes or sizes.

The upper extended electrodes 232 and the lower extended electrodes 233 may be made of the same material or different materials.

Also in the circuit module 2 having the above-described structure, similar to the first preferred embodiment, the end portions of both of the inner-layer ground electrode 131 and the extended electrodes (the upper extended electrodes 232 and the lower extended electrodes 233 in the present modification) are exposed at the side surfaces of the multilayer board 10 and connected to the shield electrode 40. Accordingly, the connection reliability between the shield electrode 40 and the inner-layer ground electrode 131 is increased.

In addition, in the circuit module 2 according to the present preferred embodiment, the upper extended electrodes 232 and the lower extended electrodes 233 are extended electrodes. Thus, the extended electrodes include electrodes disposed in a plurality of layers (the upper extended electrodes 232 and the lower extended electrodes 233). In this case, the occurrence of warping and distortion of the side end portions of the multilayer board 10, which are easily warped or distorted, are further reduced or prevented. Accordingly, the connection reliability between the shield electrode 40 and the inner-layer ground electrode 131 is further increased.

In addition, since the extended electrodes (the upper extended electrodes 232 and the lower extended electrodes 233) are disposed above and below the inner-layer ground electrode 131, the connection reliability between the shield electrode 40 and the inner-layer ground electrode 131 is increased irrespective of the manner in which the multilayer board 10 is warped or distorted.

More specifically, the multilayer board 10 may be warped in an upwardly convex shape or a downwardly convex shape depending on, for example, the distribution of the patterned wires 121 in the multilayer board 10 and the locations of the mounting components 21 to 23. The extended electrodes to which the shield electrode 40 easily comes into contact over a large contact area may switch between the upper extended electrodes 232 and the lower extended electrodes 233 depending on the shape in which the multilayer board 10 is warped. Since the upper extended electrodes 232 and the lower extended electrodes 233 are provided, the connection reliability between the shield electrode 40 and the inner-layer ground electrode 131 is increased irrespective of the manner in which the multilayer board 10 is warped or distorted.

In addition, in the circuit module 2 according to the present preferred embodiment, the upper extended electrodes 232 and the lower extended electrodes 233 are alternately arranged when viewed in the lamination direction. Therefore, the thickness of the extended electrodes in the lamination direction is uniform or substantially uniform. Accordingly, warping and distortion of the multilayer board 10 are further reduced or prevented.

Although circuit modules according to preferred embodiments of the present invention and modifications thereof are described above, the present invention is not limited to each of the above-described preferred embodiments and the modifications thereof. Preferred embodiments obtained by making various changes conceivable by those skilled in the art to the above-described preferred embodiments and the modifications thereof and preferred embodiments obtained by combining the components of different ones of the above-described preferred embodiments and the modifications thereof are also included in the scope of the present invention without departing from the spirit of the present invention.

For example, according to the above description, when viewed in the lamination direction, the end portions of the extended electrodes are connected to the shield electrode 40 at the sides of the multilayer board 10 adjacent to the portions in which the density of the patterned wires 121 is lower than that in other portions. However, the end portions of the extended electrodes may, instead, be connected to the shield electrode 40 at the sides of the multilayer board 10 adjacent to the portions in which the density of the patterned wires 121 is high.

In addition, for example, according to the above description, a plurality of extended electrodes are disposed in the same layer of the multilayer board 10. However, a single extended electrode may, instead, be disposed in a single layer of the multilayer board 10.

In addition, for example, in the above-described second preferred embodiment, the upper extended electrodes 232 and the lower extended electrodes 233 are alternately arranged when viewed in the lamination direction. However, both of the upper extended electrodes 232 and the lower extended electrodes 233 may be arranged successively.

In addition, the dummy electrodes 151 and the BAS paste layer 161 may at least partially overlap the extended electrodes when viewed in the lamination direction.

In addition, for example, the multilayer board 10 may include a plurality of electrode sets which each include a single inner-layer ground electrode 131 and one or more extended electrodes that extend from the inner-layer ground electrode 131.

In addition, for example, the extended electrodes are preferably connected to the inner-layer ground electrode 131 with no patterned wires 121 provided therebetween (in other words, the extended electrodes preferably extend from the inner-layer ground electrode 131). However, the extended electrodes may, instead, be connected to the inner-layer ground electrode 131 through the patterned wires 121.

In addition, for example, the extended electrodes may, instead, be disposed only in one or more of the peripheral end portions of the multilayer board 10 when viewed in the lamination direction. More specifically, the shield electrode 40 may be connected to the extended electrodes at only one of the side surfaces of the multilayer board 10.

Preferred embodiments of the present invention are widely applicable to circuit module components for communications devices, such as cellular phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module comprising:
a multilayer board including an inner-layer ground electrode and an extended electrode that extends from the inner-layer ground electrode;
a mounting component mounted on the multilayer board;
a resin that covers the mounting component; and
a shield electrode that covers the resin and at least a portion of a side surface of the multilayer board; wherein
the extended electrode is electrically connected to the inner-layer ground electrode in the multilayer board and is arranged so that at least a portion of the extended electrode overlaps the inner-layer ground electrode when viewed in a lamination direction of the multilayer board;

each of the inner-layer ground electrode and the extended electrode is disposed in an inner layer of the multilayer board;

an end portion of the extended electrode is exposed at the side surface of the multilayer board and connected to the shield electrode at the side surface; and an end portion of the inner-layer ground electrode is exposed at the side surface of the multilayer board and connected to the shield electrode at the side surface.

2. The circuit module according to claim 1, wherein
the multilayer board includes one or more patterned wires in an inner layer of the multilayer board, the one or more patterned wires defining a predetermined circuit together with the mounting component; and the end portion of the extended electrode is connected to the shield electrode at a side of the multilayer board adjacent to a portion in which a density of the patterned wires is lower than in other portions when viewed in the lamination direction.

3. The circuit module according to claim 1, wherein the extended electrode is disposed directly on the inner-layer ground electrode.

4. The circuit module according to claim 1, wherein a plurality of the extended electrodes are disposed in a same layer of the multilayer board.

5. The circuit module according to claim 1, wherein the extended electrode includes:
　an upper extended electrode disposed above the inner-layer ground electrode; and
　a lower extended electrode disposed below the inner-layer ground electrode.

6. The circuit module according to claim 5, wherein the upper extended electrode and the lower extended electrode are alternately arranged along a side of the multilayer board when viewed in the lamination direction.

7. The circuit module according to claim 5, wherein
a plurality of the upper extended electrodes are disposed in a same layer of the multilayer board; and
a plurality of the lower extended electrodes are disposed in a same layer of the multilayer board.

8. The circuit module according to claim 5, wherein the plurality of upper extended electrodes and the plurality of lower extended electrodes are alternately arranged along a side of the multilayer board when viewed in the lamination direction.

9. The circuit module according to claim 1, wherein the multilayer board further includes a dummy electrode disposed at a position at which the dummy electrode does not overlap the extended electrode when viewed in the lamination direction.

10. The circuit module according to claim 1, wherein the multilayer board further includes a barium aluminum silicate paste layer disposed at a position at which the barium aluminum silicate paste layer does not overlap the extended electrode when viewed in the lamination direction.

11. The circuit module according to claim 1, wherein the inner-layer ground electrode extends over an entire or substantially an entire area of the multilayer board when viewed in the lamination direction.

12. The circuit module according to claim 1, wherein the extended electrode is disposed only in an end portion of the multilayer board when viewed in the lamination direction.

13. The circuit module according to claim 1, wherein the extended electrode is connected to the inner-layer ground electrode through a via.

14. The circuit module according to claim 1, wherein the extended electrode extends along the side of the multilayer board.

15. The circuit module according to claim 1, wherein the extended electrode overlaps the inner-layer ground electrode over an entire or substantially an entire area of the extended electrode.

16. The circuit module according to claim 10, wherein the barium aluminum silicate paste layer is disposed in a layer different from a layer in which the inner-layer ground electrode is disposed.

17. The circuit module according to claim 10, wherein the barium aluminum silicate paste layer includes barium, aluminum, and silicon as main components thereof.

18. The circuit module according to claim 10, wherein the upper extended electrode and the lower extended electrode have a same or substantially a same shape and size.

* * * * *